US009483990B2

(12) United States Patent
Xiao

(10) Patent No.: US 9,483,990 B2
(45) Date of Patent: Nov. 1, 2016

(54) GATE DRIVER ON ARRAY (GOA) CIRCUIT AND LCD DEVICE USING THE SAME

(71) Applicant: Shenzhen China Star Optoelectronics Technology Co., Ltd., Shenzhen, Guangdong (CN)

(72) Inventor: Juncheng Xiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 314 days.

(21) Appl. No.: 14/376,130

(22) PCT Filed: May 6, 2014

(86) PCT No.: PCT/CN2014/076829
§ 371 (c)(1),
(2) Date: Jul. 31, 2014

(87) PCT Pub. No.: WO2015/161528
PCT Pub. Date: Oct. 29, 2015

(65) Prior Publication Data
US 2016/0275887 A1 Sep. 22, 2016

(30) Foreign Application Priority Data

Apr. 24, 2014 (CN) .......................... 2014 1 0167258

(51) Int. Cl.
*G09G 3/36* (2006.01)
*H01L 27/12* (2006.01)
(52) U.S. Cl.
CPC ........... *G09G 3/3648* (2013.01); *H01L 27/124* (2013.01); *H01L 27/1255* (2013.01); *G09G 2300/0809* (2013.01); *G09G 2310/0251* (2013.01); *G09G 2310/06* (2013.01); *G09G 2310/08* (2013.01); *G09G 2320/0204* (2013.01)

(58) Field of Classification Search
CPC ................... G09G 3/3648; G09G 2300/0809; G09G 2310/0251; G09G 2310/06; G09G 2310/08; G09G 2320/0204; H01L 27/124; H01L 27/1255
IPC .................................................. G09G 2310/08
See application file for complete search history.

(56) References Cited

U.S. PATENT DOCUMENTS

| 7,633,477 B2 * | 12/2009 | Jang ....................... G11C 19/28 345/100 |
| 2010/0214279 A1 * | 8/2010 | Kim ....................... G09G 3/344 345/213 |

* cited by examiner

Primary Examiner — Abbas Abdulselam
(74) Attorney, Agent, or Firm — Andrew C. Cheng

(57) ABSTRACT

A gate driver on array (GOA) circuit for a liquid crystal display is disclosed. The GOA circuit includes multiple cascaded GOA units, and a Nth stage GOA unit controls a charging of a Nth stage horizontal scanning line of a display area. The Nth stage GOA unit includes a pull-up circuit, a pull-down circuit, a first pull-down holding circuit, a second pull-down holding circuit, a pull-up control circuit, a transfer circuit, and a boast capacitor. The present invention also discloses a liquid crystal display (LCD) device. The present invention can decrease the cost of the LCD device, improve the functionality of the GOA circuit, and increase the operation life.

20 Claims, 6 Drawing Sheets

GATE DRIVER ON ARRAY (GOA) CIRCUIT AND LCD DEVICE USING THE SAME

CROSS REFERENCE TO RELATED APPLICATIONS

This application is claiming a priority arisen from a patent application, entitled with "GATE DRIVER ON ARRAY (GOA) CIRCUIT AND LCD DEVICE USING THE SAME", submitted to China Patent Office on Apr. 24, 2014, designated with an Application Number: 201410167258.0. The whole and complete disclosure of such patent application is hereby incorporated by reference. This application also related to National Stage application Ser. No. 14/376,127, submitted on the same date, entitled, "GATE DRIVER ON ARRAY (GOA) CIRCUIT AND LCD DEVICE USING THE SAME" assigned to the same assignee.

BACKGROUND OF THE INVENTION

1. Field of the Invention

The present invention relates to a liquid crystal display, and more particular to a gate driver on array (GOA) circuit and a liquid crystal display device.

2. Description of Related Art

In an active matrix liquid crystal display device, each pixel has a thin film transistor (TFT), the gate of the TFT is connected to a horizontal scanning line, the drain of the TFT is connected to a vertical data line, and the source of the TFT is connected to a pixel electrode. Applying sufficient voltage on the horizontal scanning line, every TFT on the horizontal scanning line will be turned on. The horizontal scanning lines are connected to the vertical data line in order to write a display signal voltage on the data line to the pixel, and achieve the effect of controlling the color through controlling different transmittance of the liquid crystals.

Currently, the driving of the horizontal scanning lines of an active matrix liquid crystal display (LCD) panel is using an external IC connected at the outside of the panel. The external IC can control every stage of the horizontal scanning lines to charge and discharge.

The gate driver on array (GOA) technology can utilize the original fabrication process of the LCD panel to fabricate a driving circuit of the horizontal scan lines on the substrate around the display region such that the driving circuit can replace the external IC to drive the horizontal scan lines. The GOA technology can reduce the bonding process for the external IC to increase productivity and reduce product cost such that the LCD panel is more suitable for the narrow frame or no frame display product.

The conventional GOA circuit generally includes multiple cascaded GOA units; each of the GOA units corresponds to drive a stage of horizontal scanning line. The GOA unit mainly includes a pull-up circuit, a pull-up control circuit, a transfer circuit, a pull-down circuit, a pull-down holding circuit, and a boast capacitor used to boost a voltage. Wherein the pull-up circuit is mainly responsible for outputting a clock signal as a gate signal; the pull-up control circuit is responsible for controlling a turn-on time of the pull-up circuit, and generally connected to a transfer signal or a gate signal from the previous stage GOA unit; the pull-down circuit is responsible for pulling down the gate signal to a low level voltage immediately, that is, turning off the gate signal; the pull-down holding circuit is responsible for holding a gate output signal or the gate signal of the pull-up circuit (commonly referred to as a Q node) at a turn-off state (i.e., a negative voltage). Usually, two pull-down holding circuits function alternatively; the boast capacitor is responsible for secondarily boosting the voltage of the Q node to facilitate the G (N) output of the pull-up circuit.

As shown in FIG. 1, a schematic diagram of a conventional GOA circuit is shown. In FIG. 1, a GOA unit comprises: a pull-up control circuit 100, a pull-up circuit 200, a transfer circuit 300, a pull-down circuit 400, a boast capacitor 600, a first pull-down holding circuit 510, and a second pull-down holding circuit 520.

FIG. 2 shows waveforms of input signals, output signals, and key nodes of the GOA circuit in FIG. 1. Wherein, CK and XCK are two complementary signals in phase; VSS2<VSS1; G (N) and G (N+1) are gate output signals of Nth stage and (N+1) th stage. As shown in FIG. 2, G(N) will be pulled down to a low level voltage VSS1, and P (N) will be pulled down to a low level voltage VSS2 which is lower than VSS1 when Q (N) and G (N) are at high level voltages.

However, the conventional GOA circuit has following shortcomings:

First, the voltage of the node Q (N) is not boosted enough in a first time stage, which will affect the voltage level of the node Q (N) in a second time stage. The voltage lack of the node Q (N) will directly affect the output of G (N), the transfer of the circuit, and the starting speed of the pull-down circuit. Specifically, because the voltage lack of the node Q (N), the starting speed of T21 and T22 will be delayed, and the output of G (N) and ST (N) exist a larger delay.

Besides, the delay of G (N) will affect the charging of the pixel TFT in the display area. In a serious case, a charging error will generate such that the screen is abnormal.

In addition, the delay of ST (N) will directly affect the starting of the pull-down holding circuit. When the delay of ST (N) is too serious, the voltage boost of the node P (N) will be slow such that the voltage of the node P (N) in the non-operation period is delayed. In the serious case, the ripple current will generate at Q (N) and G (N) in order to affect the operation of the circuit.

Furthermore, the pulling down of ST (N) will have a risk when the pulling down is executed by the XCK signal. Specifically in the pulling down circuit, except the pulling down of P (N), no more pulling down preventing design is existed. If the pulling down by a single side is failed, the entire circuit is failed. When the ST (N) signal is used more as in FIG. 1, how to handle the ST (N) signal is especially important. If the ST (N) signal is not handled properly, the entire pull-down holding circuit will fail, and the entire GOA circuit will also fail in a serious case.

SUMMARY OF THE INVENTION

The technical problem solved by the present invention is to provide a GOA circuit used for a liquid crystal display and a liquid crystal display (LCD) device in order to reduce the cost of the LCD device, improve the poor functionality of the GOA circuit, and improve the operating life of the GOA circuit.

To solve the above technical problem, an embodiment of the present invention provides: a gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:

a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a first low direct current (DC) input voltage;
a second TFT, wherein, a gate of the second TFT is connected to the first circuit node P; a drain and a source of the second TFT are respectively connected to the gate signal node and the first low direct current (DC) input voltage;
a third TFT, wherein, a gate of the third TFT is connected to a second circuit node; a drain and a source of the third TFT are respectively connected to the first circuit node and a second low direct current (DC) input voltage;
a fourth TFT, wherein, a source of the fourth TFT is connected to the first circuit node; a gate and a drain of the fourth TFT are both connected to a first clock signal; and
a seventh TFT, wherein, a gate of the seventh TFT is connected to the first circuit node; a drain and source of the seventh TFT are respectively connected to the second circuit node and the second low direct current (DC) input voltage;
a second pull-down holding circuit;
a pull-up control circuit;
a transfer circuit; and
a boast capacitor;
wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the second low direct current (DC) input voltage is lower than the first low direct current (DC) input voltage.

Wherein, the pull-down circuit comprises:
an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage;
a nineteenth TFT, wherein, a gate of the nineteenth TFT is connected to the gate of the eighteenth TFT; a drain and a source of the nineteenth TFT are respectively connected to the gate signal node and the first low direct current (DC) input voltage; and
a twentieth TFT, wherein, a gate of the twentieth TFT is connected to the gate of the eighteenth TFT; a drain and a source of the twentieth TFT are respectively connected to the Nth stage horizontal scanning line and inputting the second low direct current (DC) input voltage.

Wherein, the pull-up circuit comprises:
a fifteenth TFT, wherein a gate of the fifteenth TFT is connected to the gate signal node, a drain and a source of the fifteenth are respectively connected to the first clock signal and the Nth stage horizontal scanning line;
the transfer circuit comprises:
a sixteenth TFT, a gate of the sixteenth TFT is connected to the gate signal node; a drain and a source of the sixteenth TFT are respectively connected to the first clock signal and outputting a Nth stage starting signal ST (N); and the pull-up control circuit comprises:
a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

Wherein, the second pull-down holding circuit comprises:
an eighth TFT, wherein a gate of the eighth TFT is connected to the second clock signal, a drain and a source of the eighth TFT are respectively connected to the Nth stage horizontal scanning line and inputting the first low direct current (DC) input voltage; and
a ninth TFT, wherein, a gate of the ninth TFT is connected to the gate of the eighth TFT; a drain and a source of the ninth TFT are respectively connected to the gate signal node and inputting the (N−1)th stage starting signal ST (N−1);
the first pull-down holding circuit further comprises:
a sixth TFT, wherein, a drain of the sixth TFT is connected to the first clock signal; a gate and a source of the sixth TFT are both the first circuit node;
wherein, the first clock signal and the second clock signal are two complementary signals in phase.

Wherein, the GOA circuit further comprises: a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage; and
a twelfth TFT, wherein, a source of the twelfth TFT is connected to the gate of the tenth TFT; a drain and a gate of the twelfth TFT are both connected to the first clock signal.

Wherein, the GOA circuit further comprises a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage;
a twelfth TFT, wherein, a source of the twelfth TFT is connected to the gate of the tenth TFT; a drain and a gate of the twelfth TFT are both connected to the second clock signal; and
a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

Wherein, the second pull-down holding circuit comprises:
a fourteenth TFT, a gate and a source of the fourteenth TFT are both inputting the (N−1)th stage starting signal ST (N−1); a drain of the fourteenth TFT is connected to the gate signal node;
a fifth TFT, wherein, a gate of the fifth TFT inputting the (N−1)th stage starting signal ST (N−1); a drain and a source of the fifth TFT are respectively connected to the first circuit node and inputting the second low direct current (DC) input voltage; and
a sixth TFT, wherein, a gate of the sixth TFT is connected to the second clock signal; a drain of the sixth TFT is connected to the first clock signal; a source of the sixth TFT is connected to the first circuit node.

Correspondingly, another aspect of an embodiment of the present invention also provides: a gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:

a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a first low direct current (DC) input voltage;
a second TFT, wherein, a gate of the second TFT is connected to a first circuit node; a drain and a source of the second TFT are respectively connected to the gate signal node and the first low direct current (DC) input voltage;
a third TFT, wherein, a gate of the third TFT is connected to a second circuit node; a drain and a source of the third TFT are respectively connected to the first circuit node and a second low direct current (DC) input voltage;
a fourth TFT, wherein, a source of the fourth TFT is connected to the first circuit node; a gate and a drain of the fourth TFT are both connected to a first clock signal;
a sixth TFT, wherein, a drain of the sixth TFT T54 is connected to the first clock signal CK; a gate and a source of the sixth TFT T54 are both connected to the first circuit node;
an eighth TFT, wherein a gate of the eighth TFT is connected to the second clock signal, a drain and a source of the eighth TFT are respectively connected to the Nth stage horizontal scanning line and inputting the first low direct current (DC) input voltage;
a ninth TFT, wherein, a gate of the ninth TFT is connected to the gate of the eighth TFT; a drain and a source of the ninth TFT are respectively connected to the gate signal node and inputting the (N−1)th stage starting signal;
a second pull-down holding circuit;
a pull-up control circuit;
a transfer circuit; and
a boast capacitor;
wherein, the first clock signal and the second clock signal are two complementary signals in phase; the second low direct current (DC) input voltage is lower than the first low direct current (DC) input voltage.

Wherein, the GOA circuit further comprises: a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage; and
a twelfth TFT, wherein, a source of the twelfth TFT is connected to the gate of the tenth TFT; a drain and a gate of the twelfth TFT are both connected to the first clock signal.

Wherein, the pull-down circuit comprises:
an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage; and
a nineteenth TFT, wherein, a gate of the nineteenth TFT is connected to the gate of the eighteenth TFT; a drain and a source of the nineteenth TFT are respectively connected to the gate signal node and the first low direct current (DC) input voltage.

Wherein, the pull-down circuit further comprises:
a twentieth TFT, wherein, a gate of the twentieth TFT is connected to the gate of the eighteenth TFT; a drain and a source of the twentieth TFT are respectively connected to the Nth stage horizontal scanning line and inputting the second low direct current (DC) input voltage.

Wherein, the GOA circuit further comprises a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage;
a twelfth TFT, wherein, a source of the twelfth TFT is connected to the gate of the tenth TFT; a drain and a gate of the twelfth TFT are both connected to the second clock signal; and
a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

Wherein, the pull-down circuit comprises:
an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage;
a nineteenth TFT, wherein, a gate of the nineteenth TFT is connected to the gate of the eighteenth TFT; a drain and a source of the nineteenth TFT are respectively connected to the gate signal node and the first low direct current (DC) input voltage; and
a seventh TFT, wherein, a gate of the seventh TFT is connected to the first circuit node; a drain and source of the seventh TFT are respectively connected to the second circuit node and the second low direct current (DC) input voltage;

Wherein, the pull-up circuit comprises:
a fifteenth TFT, wherein a gate of the fifteenth TFT is connected to the gate signal node, a drain and a source of the fifteenth are respectively connected to the first clock signal and the Nth stage horizontal scanning line;
the transfer circuit comprises:
a sixteenth TFT, a gate of the sixteenth TFT is connected to the gate signal node; a drain and a source of the sixteenth TFT are respectively connected to the first clock signal and outputting a Nth stage starting signal ST (N); and
the pull-up control circuit comprises:
a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

Wherein, the pull-up circuit comprises:
  a fifteenth TFT, wherein a gate of the fifteenth TFT is connected to the gate signal node, a drain and a source of the fifteenth are respectively connected to the first clock signal and the Nth stage horizontal scanning line;
  the transfer circuit comprises:
  a sixteenth TFT, a gate of the sixteenth TFT is connected to the gate signal node; a drain and a source of the sixteenth TFT are respectively connected to the first clock signal and outputting a Nth stage starting signal ST (N); and
  the pull-up control circuit comprises:
  a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

Wherein, the pull-up circuit comprises:
  a fifteenth TFT, wherein a gate of the fifteenth TFT is connected to the gate signal node, a drain and a source of the fifteenth are respectively connected to the first clock signal and the Nth stage horizontal scanning line;
  the transfer circuit comprises:
  a sixteenth TFT, a gate of the sixteenth TFT is connected to the gate signal node; a drain and a source of the sixteenth TFT are respectively connected to the first clock signal and outputting a Nth stage starting signal ST (N); and
  the pull-up control circuit comprises:
  a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

Correspondingly, another aspect of an embodiment of the present invention also provides: a liquid crystal display device including a gate driver on array (GOA) circuit having multiple cascaded GOA units, a Nth stage GOA unit for controlling a charging of a Nth stage horizontal scanning line of a display area, and the Nth stage GOA unit comprising:
  a pull-up circuit;
  a pull-down circuit;
  a first pull-down holding circuit and having:
    a first thin-film transistor (TFT), wherein, a gate of the first TFT is connected to a first circuit node; a drain and a source of the first TFT are respectively connected to the Nth stage horizontal scanning lines and a first low direct current (DC) input voltage;
    a second TFT, wherein, a gate of the second TFT is connected to the first circuit node P; a drain and a source of the second TFT are respectively connected to the gate signal node and the first low direct current (DC) input voltage;
    a third TFT, wherein, a gate of the third TFT is connected to a second circuit node; a drain and a source of the third TFT are respectively connected to the first circuit node and a second low direct current (DC) input voltage;
    a fourth TFT, wherein, a source of the fourth TFT is connected to the first circuit node; a gate and a drain of the fourth TFT are both connected to a first clock signal; and
    a seventh TFT, wherein, a gate of the seventh TFT is connected to the first circuit node; a drain and source of the seventh TFT are respectively connected to the second circuit node and the second low direct current (DC) input voltage;
  a second pull-down holding circuit;
  a pull-up control circuit;
  a transfer circuit; and
  a boast capacitor;
  wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the second low direct current (DC) input voltage is lower than the first low direct current (DC) input voltage.

Wherein, the second pull-down holding circuit comprises:
  an eighth TFT, wherein a gate of the eighth TFT is connected to the second clock signal, a drain and a source of the eighth TFT are respectively connected to the Nth stage horizontal scanning line and inputting the first low direct current (DC) input voltage; and
  a ninth TFT, wherein, a gate of the ninth TFT is connected to the gate of the eighth TFT; a drain and a source of the ninth TFT are respectively connected to the gate signal node and inputting the (N−1)th stage starting signal ST (N−1);
  the first pull-down holding circuit further comprises:
  a sixth TFT, wherein, a drain of the sixth TFT is connected to the first clock signal; a gate and a source of the sixth TFT are both the first circuit node;
  wherein, the first clock signal and the second clock signal are two complementary signals in phase.

Wherein, the GOA circuit further comprises: a third pull-down holding circuit comprising:
  a tenth TFT, wherein, a drain and a source of the tenth TFT are respectively connected to the second circuit node and the second low direct current (DC) input voltage;
  an eleventh TFT, wherein, a gate of the eleventh TFT is connected to the gate signal node; a drain and a source of the eleventh TFT are respectively connected to the gate of the tenth TFT and inputting the first low direct current (DC) input voltage; and
  a twelfth TFT, wherein, a source of the twelfth TFT is connected to the gate of the tenth TFT; a drain and a gate of the twelfth TFT are both connected to the first clock signal.

Wherein, the GOA circuit further comprises: a third pull-down holding circuit comprising:
  a tenth TFT, wherein, a drain and a source of the tenth TFT are respectively connected to the second circuit node and the second low direct current (DC) input voltage;
  an eleventh TFT, wherein, a gate of the eleventh TFT is connected to the gate signal node; a drain and a source of the eleventh TFT are respectively connected to the gate of the tenth TFT and inputting the first low direct current (DC) input voltage;
  a twelfth TFT, wherein, a source of the twelfth TFT is connected to the gate of the tenth TFT; a drain and a gate of the twelfth TFT are both connected to the second clock signal; and
  a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

The present invention has the following advantageous effects:
First, when boosting the voltage of the nodes Q (N) in the first time stage, using the source of the T43 to connect with ST (N−1). When the ST (N−1) charges the node Q (N) in the first time stage, the node Q (N) can obtain s high level voltage to boost the voltage of the node Q (N) in the first time stage in order to solve the problem of the voltage lack of Q (N) in the first time stage. Therefore, in the second time stage, the voltage of the node Q (N) can be boosted to be higher and stable. Besides, the outputs of the G (N) and ST (N) will be rapider such that the integrity of the circuit is increased.

Furthermore, through the third pull-down holding circuit 530 to handle the ST (N) in order to prevent the lack of pulling down of the voltage so as to avoid the failure of the pull-down holding circuit. Therefore, the signals transferring to next stages are very accurate.

Meanwhile, because the first pull-down holding circuit and the second pull-down holding circuit operate alternately, and the pulling down of the voltage of the ST (N) also utilizes the tenth TFT T72 and the seventh TFT T71 to operate alternately, the operation life of the GOA circuit can be increased.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

Figure 1:
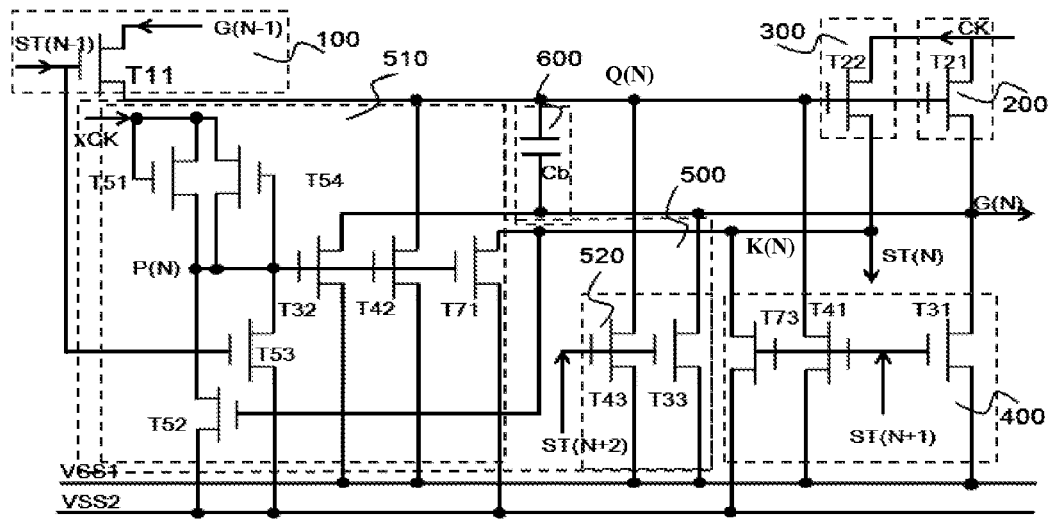
FIG. 1 is a schematic diagram of a conventional GOA circuit.
Figure 2:
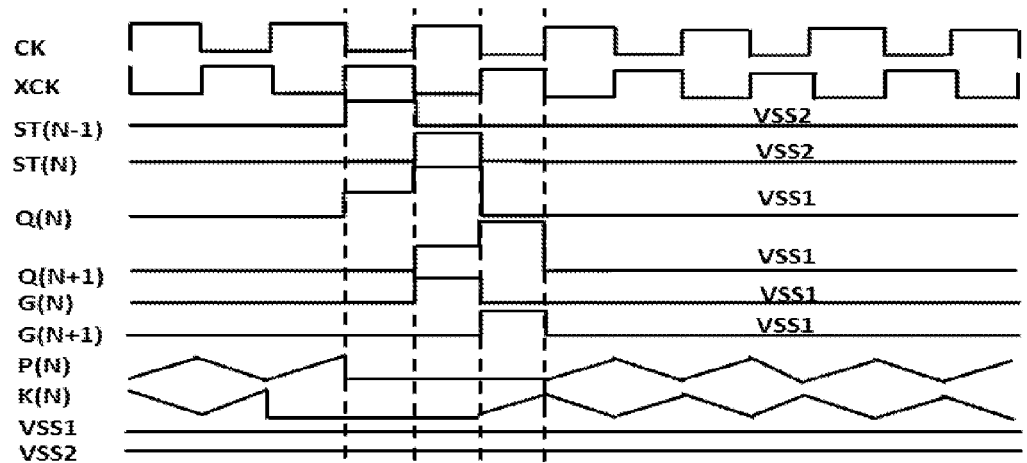
FIG. 2 is a schematic timing diagram of key nodes of the GOA circuit illustrated in FIG. 1 in an actual operation.
Figure 3:
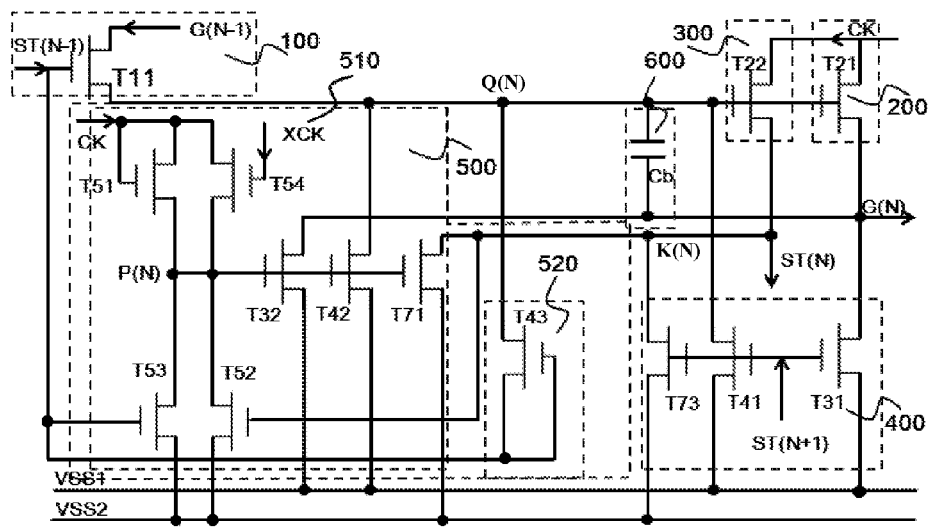
FIG. 3 is a schematic circuit diagram of a GOA circuit for a liquid crystal display according to a first embodiment of the present invention.

The following content combines with the drawings for describing preferred embodiments of the present invention As shown in FIG. 3, FIG. 3 is a schematic circuit diagram of a GOA circuit for a liquid crystal display according to a first embodiment of the present invention. In this embodiment, the GOA circuit includes multiple cascaded GOA units. A Nth stage GOA unit charges a Nth stage horizontal scanning line G (N). The Nth stage GOA unit comprises a pull-up circuit 200, a pull-down circuit 400, a first pull-down holding circuit 510, a second pull-down holding circuit 520, a pull-up control circuit 100, a transfer circuit 300, and a boast capacitor 600. Wherein, the first pull-down holding circuit 510 and the second pull-down holding circuit 520 form the pull-down holding circuit 500. The pull-up circuit 200, the pull-down circuit 400, the first pull-down holding circuit 510, the second pull-down holding circuit 520, and the boast capacitor 600 are respectively connected to a gate signal node Q (N) and a Nth stage horizontal scanning line G (N). The pull-up control circuit 100 and the transfer circuit are respectively connected to the gate signal node Q (N).

The first pull-down holding circuit 510 comprises:

a first thin-film transistor (TFT) T32, wherein, a gate of the T32 is connected to a first circuit node P (N); a drain and a source of the T32 are respectively connected to the Nth stage horizontal scanning lines G (N) and a first low direct current (DC) input voltage VSS1;

a second TFT T42, wherein, a gate of the T42 is connected to the first circuit node P (N); a drain and a source of the T42 are respectively connected to the gate signal node Q (N) and the first low direct current (DC) input voltage VSS1;

a third TFT T52, wherein, a gate of the T52 is connected to a second circuit node K (N); a drain and a source of the T52 are respectively connected to the first circuit node P (N) and a second low direct current (DC) input voltage VSS2;

a fourth TFT T51, wherein, a source of the T51 is connected to the first circuit node P (N); a gate and a drain of the T51 are both connected to a first clock signal CK;

a fifth TFT T53, wherein, a gate of the T53 inputting a (N−1)th stage starting signal ST (N−1); a drain and a source of the T53 are respectively connected to the first circuit node P (N) and inputting the second low direct current (DC) input voltage VSS2;

a sixth TFT T54, wherein, a gate of the T54 is connected to the second clock signal XCK; a drain of the T54 is connected to the first clock signal CK and a source of the T54 is connected to the first circuit node P (N); and a seventh TFT T71, wherein, a gate of the T71 is connected to the first circuit node P (N); a drain and source of the T71 are respectively connected to the second circuit node K (N) and the second low direct current (DC) input voltage VSS2;

The second pull-down holding circuit 520 comprises:

a fourteenth TFT T43, a gate and a source of the T43 are both inputting the (N−1)th stage starting signal ST (N−1); a drain of the T43 is connected to the gate signal node Q (N).

The pull-up circuit 200 comprises:

a fifteenth TFT T21, wherein a gate of the T21 is connected to the gate signal node Q (N), a drain and a source of the T21 are respectively connected to the first clock signal CK and the Nth stage horizontal scanning line G (N).

The transfer circuit 300 comprises:

a sixteenth TFT T22, a gate of the T22 is connected to the gate signal node Q (N); a drain and a source of the T22 are respectively connected to the first clock signal CK and outputting a Nth stage starting signal ST (N).

The pull-up control circuit 100 comprises:

a seventeenth TFT T11, a gate of the T11 is inputting the (N−1)th stage starting signal ST (N−1); a drain and a source of the T11 are respectively inputting the (N−1)th stage horizontal scanning line G (N−1) and connected to the gate signal node Q (N).

The pull-down circuit 400 comprises:

an eighteenth TFT T31, wherein, a gate of the T31 is inputting a (N+1)th stage starting signal ST (N+1); a drain and a source of the T31 are respectively connected to the Nth stage horizontal scanning line G (N) and inputting the first low direct current (DC) input voltage VSS1;

a nineteenth TFT T41, wherein, a gate of the nineteenth TFT T41 is connected to the gate of the eighteenth TFT T41; a drain and a source of the nineteenth TFT T41 are respectively connected to the gate signal node Q (N) and the first low direct current (DC) input voltage VSS1; and a twentieth TFT T73, wherein, a gate of the twentieth TFT T73 is connected to the gate of the eighteenth TFT T41; a drain and a source of the twentieth TFT T73 are respectively connected to the Nth stage horizontal scanning line G (N) and inputting the second low direct current (DC) input voltage VSS2.

Wherein, the second low direct current (DC) input voltage VSS2 is lower than the first low direct current (DC) input voltage VSS1. The second low direct current (DC) input voltage VSS2 is mainly responsible for pulling down the first circuit node P (N) to a low level voltage. The first low direct current (DC) input voltage VSS1 is mainly responsible for pulling down the Nth stage horizontal scanning line G (N) and the gate signal node Q (N) to a low level voltage.

Wherein, the gate of the first TFT T32 and the gate of the second TFT T42 are both connected to the first circuit node P (N). The drain of the first TFT T32 is connected to the Nth stage horizontal scanning line G (N). The drain of the second TFT T42 is connected to the gate signal node Q (N). The source of the first TFT T32 and the source of the second TFT T42 are both connected to the first low direct current (DC) input voltage VSS1. The first TFT T32 and the second TFT T42 are mainly responsible for maintaining the low level voltages of the nodes G (N) and Q (N).

The gate of the third TFT T52 is connected to ST (N). The gate of the fifth TFT T53 is connected to ST (N−1). The drain of the third TFT T52 and the drain of the fifth TFT T53 are both connected to P (N). The source of the third TFT T52 and the source of the fifth TFT T53 are both connected to VSS2. The third TFT T52 and the fifth TFT T53 are mainly responsible for pulling down P (N) and K (N) in an operation period in order to turn off the pull-down holding circuit 500 so as to prevent affecting the output of the Q (N) and G (N). The negative voltage of the VSS2 is lower than the negative voltage of the VSS1 (that is, VSS2<VSS1) in order to lower the voltage of P (N) and the voltage of ST (N). In the operation period, if the voltage of P (N) is pulled to be lower, the first TFT T32 and the second TFT T42 can be turned off better in order to prevent the output abnormality of the G (N) because of discharging to the G (N). The gate of the ninth TFT T43 and the drain of the ninth TFT T43 are both connected to ST (N−1), and the source of the ninth TFT T43 is connected to the node Q (N) in order to facilitate boosting the voltage of the node Q (N) in a first time stage. The gate of the seventh TFT T71 is connected to P (N). The gate of the twentieth TFT T73 is connected to ST (N+1). The drain of the seventh TFT T71 and the drain of the twentieth TFT T73 are both connected to ST (N). The source of the seventh TFT T71 and the source of the twentieth TFT T73 are both connected to VSS2. The seventh TFT T71 and the twentieth TFT T73 are mainly responsible for pulling down the ST (N).

Figure 4:
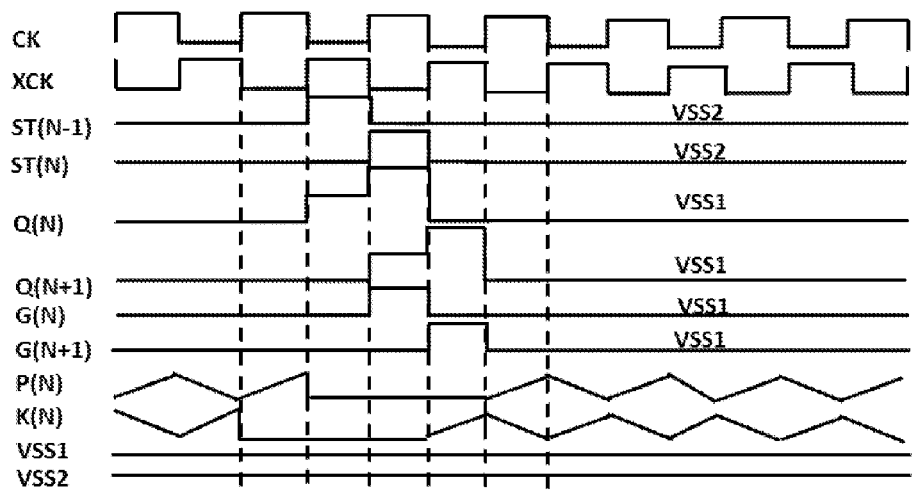
FIG. 4 is a schematic timing diagram of key nodes of the GOA circuit illustrated in FIG. 3 in an actual operation.

As shown in FIG. 4, FIG. 4 is a schematic timing diagram of key nodes of the GOA circuit illustrated in FIG. 3 in an actual operation. Wherein, the first clock signal CK and the second clock signal XCK are two complementary signals in phase. The VSS2 is lower than VSS1, and the G (N) and the G (N+1) are gate output signals by the Nth stage and the (N+1)th stage. As shown in FIG. 4, the voltages of the Q (N) and G (N) will be pulled down to VSS1, and the voltage of the node P (N) will be pulled down to VSS2 which is lower than VSS1 in the operation period. Therefore, the nodes Q (N) and G (N) can work normally in the operation period.

Figure 5:
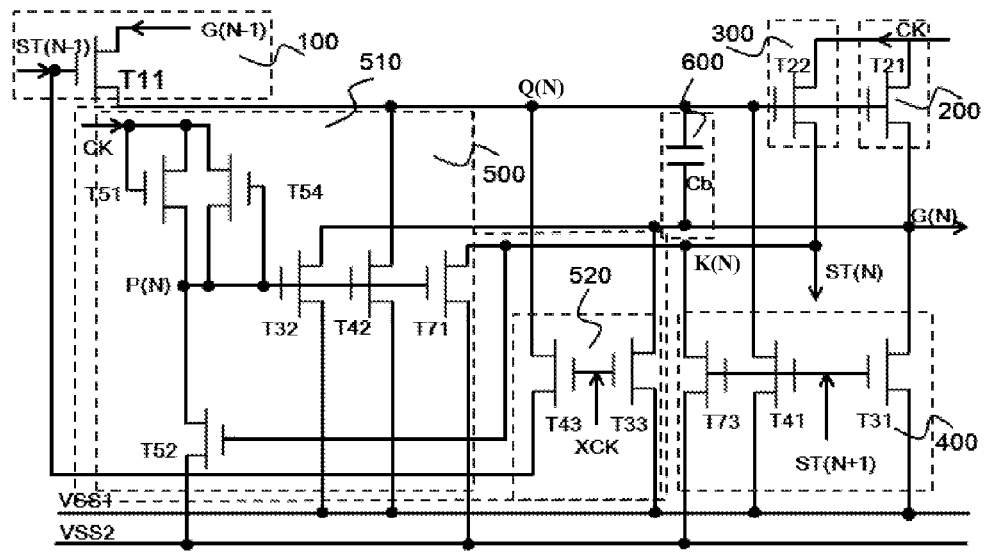
FIG. 5 is a schematic circuit diagram of a GOA circuit for a liquid crystal display according to a second embodiment of the present invention.

As shown in FIG. 5, FIG. 5 is a schematic circuit diagram of a GOA circuit for a liquid crystal display according to a second embodiment of the present invention. In this embodiment, The GOA circuit comprises multiple cascaded GOA units. Wherein, the difference between the Nth stage GOA unit in FIG. 5 and the Nth stage GOA unit in FIG. 3 is that the fifth TFT T53 does not exist, and the connection relationship between the sixth TFT T54 and the second pull-down holding circuit 520 is different. The second pull-down holding circuit 520 comprises:

an eighth TFT T33, wherein a gate of the eighth TFT T33 is connected to the second clock signal XCK, a drain and a source of the eighth TFT T33 are respectively connected to the Nth stage horizontal scanning line G (N) and inputting the first low direct current (DC) input voltage VSS1; and a ninth TFT T43, wherein, a gate of the ninth TFT T43 is connected to the gate of the eighth TFT T33; a drain and a source of the ninth TFT T43 are respectively connected to the gate signal node Q (N) and inputting the (N−1)th stage starting signal ST (N−1).

Wherein, in the first pull-down holding circuit 510, the drain of the sixth TFT T54 is connected to the first clock signal CK; the gate and the source of the sixth TFT T54 are both the first circuit node P (N).

Wherein, the first clock signal CK and the second clock signal XCK are two complementary signals in phase. The gate of the first TFT T32 and the gate of the second TFT T42 are both connected to the first circuit node P (N). The drain of the first TFT T32 is connected to the Nth stage horizontal scanning line G (N). The drain of the second TFT T42 is connected to the gate signal node Q (N). The source of the first TFT T32 and the source of the second TFT T42 are both connected to the first low direct current (DC) input voltage VSS1. The first TFT T32 and the second TFT T42 are mainly responsible for maintaining the low level voltages of the nodes G (N) and Q (N).

The gate of the third TFT T52 is connected to ST (N). The gate of the fifth TFT T53 is connected to ST (N−1). The drain of the third TFT T52 and the drain of the fifth TFT T53 are both connected to P (N). The source of the third TFT T52 and the source of the fifth TFT T53 are both connected to VSS2. The third TFT T52 and the fifth TFT T53 are mainly responsible for pulling down P (N) and K (N) in an operation period in order to turn off the pull-down holding circuit 500 so as to prevent affecting the output of the Q (N) and G (N). The negative voltage of the VSS2 is lower than the negative voltage of the VSS1 (that is, VSS2<VSS1) in order to lower the voltage of P (N) and the voltage of ST (N). In the operation period, if the voltage of P (N) is pulled to be lower, the first TFT T32 and the second TFT T42 can be turned off better in order to prevent the output abnormality of the G (N) because of discharging to the G (N).

The gate of the seventh TFT T71 is connected to P (N). The gate of the twentieth TFT T73 is connected to ST (N+1). The drain of the seventh TFT T71 and the drain of the twentieth TFT T73 are both connected to ST (N). The source of the seventh TFT T71 and the source of the twentieth TFT T73 are both connected to VSS2. The seventh TFT T71 and the twentieth TFT T73 are mainly responsible for pulling down the ST (N).

The gate of the eighth TFT T33 and the gate of the ninth TFT T43 are both connected to the signal XCK. The drain of the eighth TFT T33 is connected to G (N) and the drain of the ninth TFT T43 is connected to Q (N). The source of the eighth TFT T33 is connected to VSS1 and the source of the ninth TFT T43 is connected to the ST (N−1). The above arrangement can facilitate boosting the voltage of the node Q (N) in a first time stage.

The asymmetric second pull-down holding circuit 520 can work with the first pull-down holding circuit 510 alternatively in order to complete an alternation function together. The corresponding waveform can refer to FIG. 4.

Figure 6:
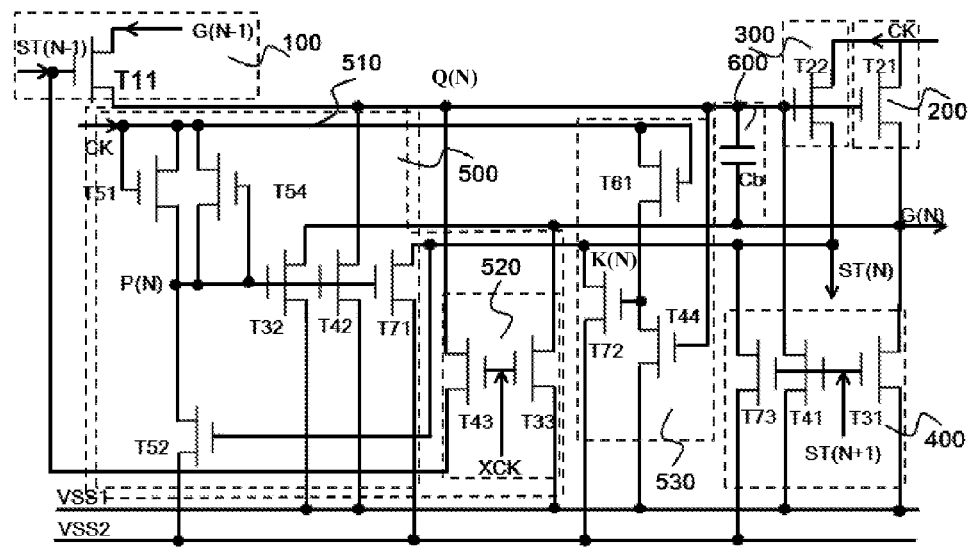
FIG. 6 is a schematic circuit diagram of a GOA circuit for a liquid crystal display according to a third embodiment of the present invention.

As shown in FIG. 6, FIG. 6 is a schematic circuit diagram of a GOA circuit for a liquid crystal display according to a third embodiment of the present invention. In this embodiment, the GOA circuit comprises multiple cascaded GOA units. The difference between the Nth stage GOA unit in FIG. 6 and the Nth stage GOA unit in FIG. 5 is that based on FIG. 5, the pull-down holding circuit 520 further comprises a third pull-down holding circuit 530. The third pull-down holding circuit 530 comprises:

a tenth TFT T72, wherein, a drain and a source of the tenth TFT T72 are respectively connected to the second circuit node K (N) and the second low direct current (DC) input voltage VSS2;

an eleventh TFT T44, wherein, a gate of the eleventh TFT T44 is connected to the gate signal node Q (N); a drain and a source of the eleventh TFT T44 are respectively connected to the gate of the tenth TFT T72 and inputting the first low direct current (DC) input voltage VSS1; and a twelfth TFT T61, wherein, a source of the twelfth TFT T61 is connected to the gate of the tenth TFT T72; a drain and a gate of the twelfth TFT T61 are connected to the first clock signal CK.

Wherein, in the present embodiment, the third pull-down holding circuit 530 is added. The third pull-down holding circuit 530 is used for pulling down the ST (N) in order to ensure that the ST (N) continues to achieve the function during the time other than the operation period. The ripple voltage with the lack of pulling down of the signal ST (N) is prevented. Wherein, the eleventh TFT T44 is used to control on the T72. The twelfth TFT T61 charges the gate of the tenth TFT T72 by the first clock signal CK. Because the twelfth TFT T61 functions as a diode, the twelfth TFT T61 cannot discharge, and will maintain in a high level voltage. Besides, the twelfth TFT T61 maintains an opposite voltage with the node Q (N) through the eleventh TFT T44. Therefore, in the non-operation period, ST (N) continues to be pulled down through tenth TFT T72. The operation principle of the other elements can refer to the illustration of FIG. 5, and the corresponding waveforms can refer to FIG. 4.

Figure 7:
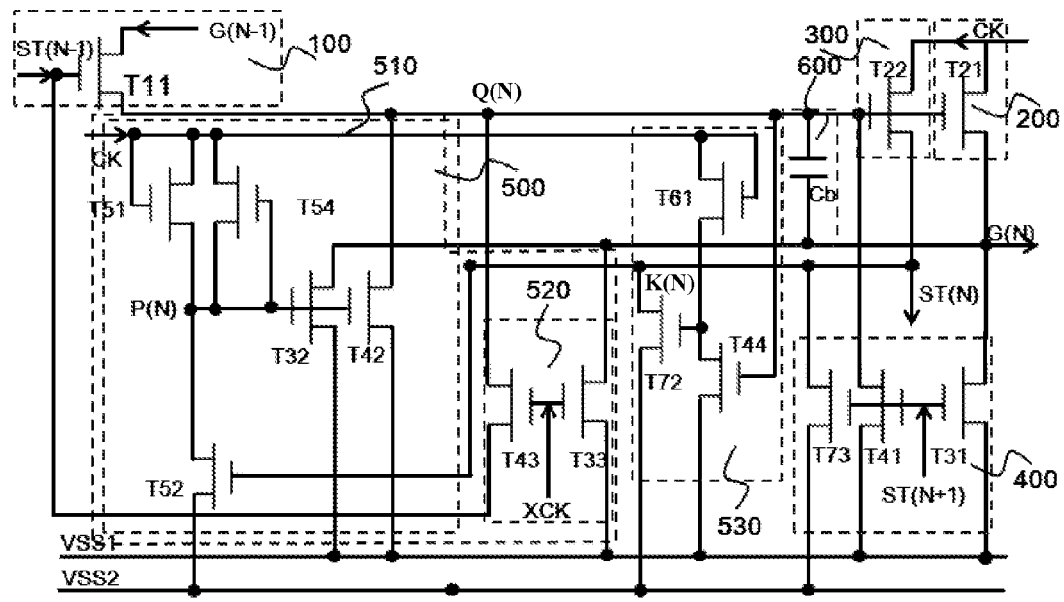
FIG. 7 is a schematic circuit diagram of a GOA circuit for a liquid crystal display according to a fourth embodiment of the present invention.

As shown in FIG. 7, FIG. 7 is a schematic circuit diagram of a GOA circuit for a liquid crystal display according to a fourth embodiment of the present invention. In this embodiment, the GOA circuit comprises multiple cascaded GOA units. The difference between the Nth stage unit in FIG. 7 and FIG. 6 is that the seventh TFT T71 is eliminated in the first pull-down holding circuit 510. The other structure is the same as FIG. 6.

With reference to the illustration for the circuit principle of FIG. 6, because in the non-operation period, the voltage of the node ST (N) continues to be pulled down through tenth TFT T72, the function of the seventh TFT T71 is achieved. Therefore, the seventh TFT T71 can be eliminated. The corresponding waveforms can refer to FIG. 4.

Figure 8:
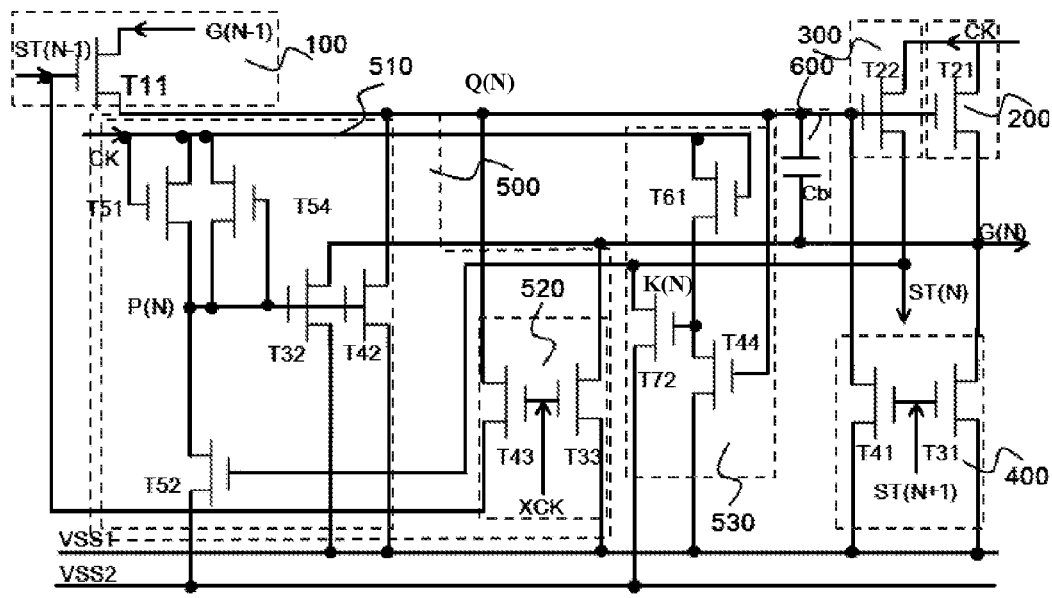
FIG. 8 is a schematic circuit diagram of a GOA circuit for a liquid crystal display according to a fifth embodiment of the present invention.

As shown in FIG. 8, FIG. 8 is a schematic circuit diagram of a GOA circuit for a liquid crystal display according to a fifth embodiment of the present invention. In this embodiment, the GOA circuit comprises multiple cascaded GOA units. The difference between the Nth stage unit in FIG. 8 and FIG. 7 is that the twentieth TFT T73 is eliminated in the pull-down circuit 400. The other structure is the same as FIG. 7.

With reference to the illustration for the circuit principle of FIG. 6, because in the non-operation period, the voltage of the node ST (N) continues to be pulled down through tenth TFT T72, the function of the twentieth TFT T73 is achieved. Therefore, the twentieth TFT T73 can be eliminated. The corresponding waveforms can refer to FIG. 4.

Figure 9:
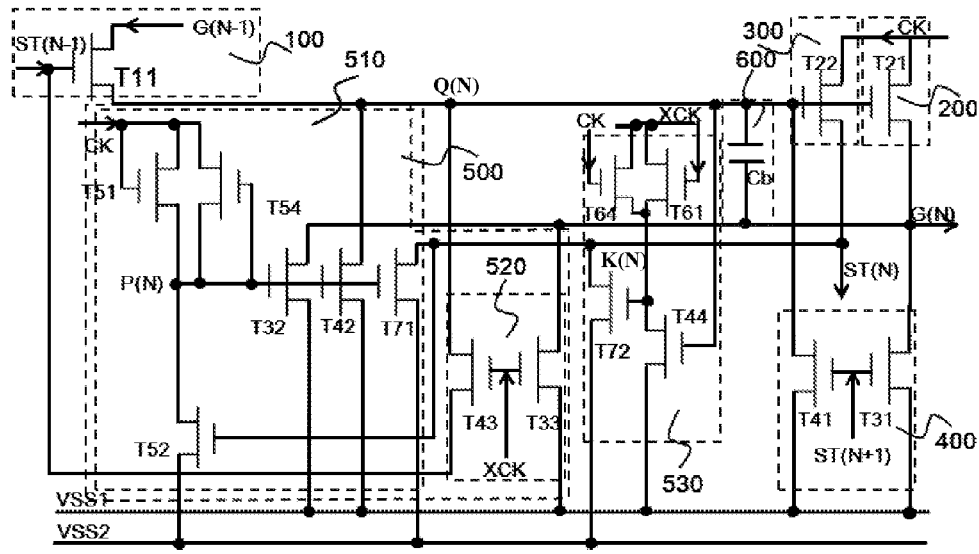
FIG. 9 is a schematic circuit diagram of a GOA circuit for a liquid crystal display according to a sixth embodiment of the present invention.

As shown in FIG. 9, FIG. 9 is a schematic circuit diagram of a GOA circuit for a liquid crystal display according to a sixth embodiment of the present invention. In this embodiment, the GOA circuit comprises multiple cascaded GOA units. The difference between the Nth stage unit in FIG. 9 and FIG. 6 is that the third pull-down holding circuit 530 comprises:

a tenth TFT T72, wherein, a drain and a source of the tenth TFT T72 are respectively connected to the second circuit node K (N) and the second low direct current (DC) input voltage VSS2;

an eleventh TFT T44, wherein, a gate of the eleventh TFT T44 is connected to the gate signal node Q (N); a drain and a source of the eleventh TFT T44 are respectively connected to the gate of the tenth TFT T72 and inputting the first low direct current (DC) input voltage VSS1;

a twelfth TFT T61, wherein, a source of the twelfth TFT T61 is connected to the gate of the tenth TFT T72; a drain and a gate of the twelfth TFT T61 are both connected to the second clock signal XCK; and a thirteenth TFT T64, wherein, a source of the thirteenth TFT T64 is connected to the gate of the tenth TFT T72; a drain of the thirteenth TFT T64 is connected to the second clock signal XCK; a gate of the thirteenth TFT T64 is connected to the first clock signal CK.

Wherein, in the present embodiment, a thirteenth TFT T64 is added in the third pull-down holding circuit 530 in order to achieve pulling down the voltage of the ST (N) alternatively by the tenth TFT T72 and the seventh TFT T71. The voltage stress of the tenth TFT T72 can be reduced in order to increase the life of the circuit. The corresponding waveforms can refer to FIG. 4.

Figure 10:
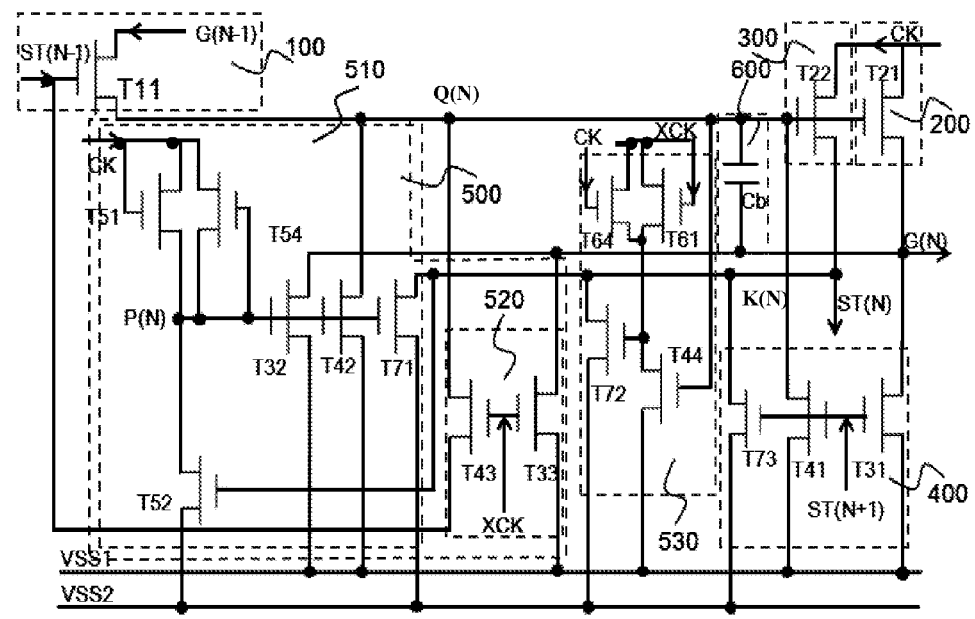
FIG. 10 is a schematic circuit diagram of a GOA circuit for a liquid crystal display according to a seventh embodiment of the present invention.

As shown in FIG. 10, FIG. 10 is a schematic circuit diagram of a GOA circuit for a liquid crystal display according to a seventh embodiment of the present invention. In this embodiment, the GOA circuit comprises multiple cascaded GOA units. The difference between the Nth stage unit in FIG. 10 and FIG. 9 is that the pull down circuit 400 still includes the twentieth TFT T73. The gate of the twentieth TFT T73 is inputting a (N+1)th stage starting signal ST (N+1). The drain of the twentieth TFT T73 is connected to the second circuit node K (N) and the source of the twentieth TFT T73 is inputting the second low direct current (DC) input voltage VSS2.

Wherein, adding the twentieth TFT T73 in the circuit shown in FIG. 9 is from the consideration of the delay of the ST (N) is smaller than the delay of the G (N). Therefore, through the twentieth TFT T73, the voltage of the ST (N) can be pulled down immediately in order to control the delay of the ST (N) more effectively. The corresponding waveforms of this embodiment can refer to FIG. 4.

Figure 11:
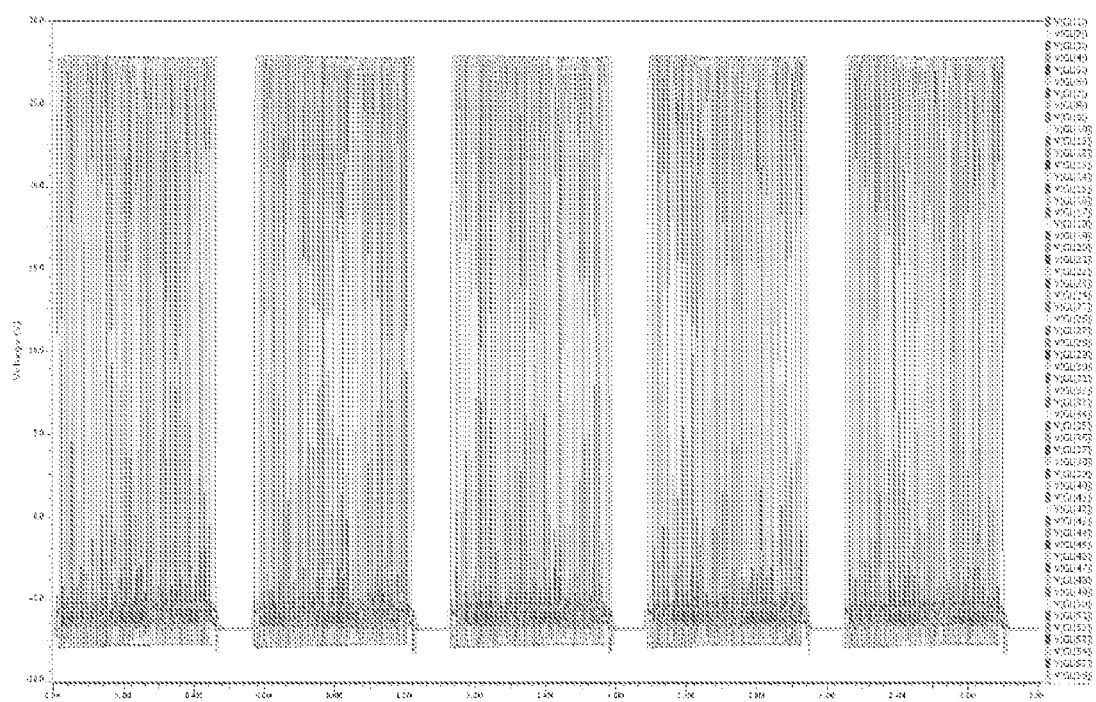
FIG. 11 is a schematic simulation diagram of the present invention using SPICE software.

As shown in FIG. 11, FIG. 11 is a schematic simulation diagram of the present invention using SPICE software. In the SPICE software, a simulation result is obtained by simulating 60 stages and 5 frames. From the simulation result, the entire circuit is outputting well. The gate voltage difference between the adjacent stages is less than 0.1V, and all stages can output completely.

Correspondingly, an embodiment of the present invention also provides with a liquid crystal display (LCD) device. The LCD device comprises the GOA circuits shown in FIG. 3 to FIG. 10.

Embodiments of the present invention have the following beneficial effects:

First, when boosting the voltage of the nodes Q (N) in the first time stage, using the source of the T43 to connect with ST (N−1). When the ST (N−1) charges the node Q (N) in the first time stage, the node Q (N) can obtain s high level voltage to boost the voltage of the node Q (N) in the first time stage in order to solve the problem of the voltage lack of Q (N) in the first time stage. Therefore, in the second time stage, the voltage of the node Q (N) can be boosted to be higher and stable. Besides, the outputs of the G (N) and ST (N) will be rapider such that the integrity of the circuit is increased.

Furthermore, through the third pull-down holding circuit 530 to handle the ST (N) in order to prevent the lack of pulling down of the voltage so as to avoid the failure of the pull-down holding circuit. Therefore, the signals transferring to next stages are very accurate.

Meanwhile, because the first pull-down holding circuit and the second pull-down holding circuit operate alternately, and the pulling down of the voltage of the ST (N) also utilizes the tenth TFT T72 and the seventh TFT T71 to operate alternately, the operation life of the GOA circuit can be increased.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:
    a pull-up circuit;
    a pull-down circuit;
    a first pull-down holding circuit and having:
        a first thin-film transistor (TFT), wherein, a gate of the first TFT is connected to a first circuit node; a drain and a source of the first TFT are respectively connected to the Nth stage horizontal scanning lines and a first low direct current (DC) input voltage;
        a second TFT, wherein, a gate of the second TFT is connected to the first circuit node P; a drain and a source of the second TFT are respectively connected to the gate signal node and the first low direct current (DC) input voltage;
        a third TFT, wherein, a gate of the third TFT is connected to a second circuit node; a drain and a source of the third TFT are respectively connected to the first circuit node and a second low direct current (DC) input voltage;
        a fourth TFT, wherein, a source of the fourth TFT is connected to the first circuit node; a gate and a drain of the fourth TFT are both connected to a first clock signal; and
        a seventh TFT, wherein, a gate of the seventh TFT is connected to the first circuit node; a drain and source of the seventh TFT are respectively connected to the second circuit node and the second low direct current (DC) input voltage;
    a second pull-down holding circuit;
    a pull-up control circuit;
    a transfer circuit; and
    a boast capacitor;
    wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the second low direct current (DC) input voltage is lower than the first low direct current (DC) input voltage.

2. The GOA circuit for the liquid crystal display according to claim 1, wherein, the pull-down circuit comprises:
    an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage;
    a nineteenth TFT, wherein, a gate of the nineteenth TFT is connected to the gate of the eighteenth TFT; a drain and a source of the nineteenth TFT are respectively connected to the gate signal node and the first low direct current (DC) input voltage; and
    a twentieth TFT, wherein, a gate of the twentieth TFT is connected to the gate of the eighteenth TFT; a drain and a source of the twentieth TFT are respectively connected to the Nth stage horizontal scanning line and inputting the second low direct current (DC) input voltage.

3. The GOA circuit for the liquid crystal display according to claim 2, wherein, the pull-up circuit comprises:
    a fifteenth TFT, wherein a gate of the fifteenth TFT is connected to the gate signal node, a drain and a source of the fifteenth are respectively connected to the first clock signal and the Nth stage horizontal scanning line;
    the transfer circuit comprises:
        a sixteenth TFT, a gate of the sixteenth TFT is connected to the gate signal node; a drain and a source of the sixteenth TFT are respectively connected to the first clock signal and outputting a Nth stage starting signal ST (N); and
    the pull-up control circuit comprises:
        a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

4. The GOA circuit for the liquid crystal display according to claim 3, wherein, the second pull-down holding circuit comprises:
    an eighth TFT, wherein a gate of the eighth TFT is connected to the second clock signal, a drain and a source of the eighth TFT are respectively connected to the Nth stage horizontal scanning line and inputting the first low direct current (DC) input voltage; and
    a ninth TFT, wherein, a gate of the ninth TFT is connected to the gate of the eighth TFT; a drain and a source of the ninth TFT are respectively connected to the gate signal node and inputting the (N−1)th stage starting signal ST (N−1);

the first pull-down holding circuit further comprises:
a sixth TFT, wherein, a drain of the sixth TFT is connected to the first clock signal; a gate and a source of the sixth TFT are both the first circuit node;
wherein, the first clock signal and the second clock signal are two complementary signals in phase.

5. The GOA circuit for the liquid crystal display according to claim 4, wherein, the GOA circuit further comprises: a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage; and
a twelfth TFT, wherein, a source of the twelfth TFT is connected to the gate of the tenth TFT; a drain and a gate of the twelfth TFT are both connected to the first clock signal.

6. The GOA circuit for the liquid crystal display according to claim 4, wherein, the GOA circuit further comprises a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage;
a twelfth TFT, wherein, a source of the twelfth TFT is connected to the gate of the tenth TFT; a drain and a gate of the twelfth TFT are both connected to the second clock signal; and
a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

7. The GOA circuit for the liquid crystal display according to claim 3, wherein, the second pull-down holding circuit comprises:
a fourteenth TFT, a gate and a source of the fourteenth TFT are both inputting the (N−1)th stage starting signal ST (N−1); a drain of the fourteenth TFT is connected to the gate signal node;
a fifth TFT, wherein, a gate of the fifth TFT inputting the (N−1)th stage starting signal ST (N−1); a drain and a source of the fifth TFT are respectively connected to the first circuit node and inputting the second low direct current (DC) input voltage; and
a sixth TFT, wherein, a gate of the sixth TFT is connected to the second clock signal; a drain of the sixth TFT is connected to the first clock signal; a source of the sixth TFT is connected to the first circuit node.

8. A gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:
a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a first low direct current (DC) input voltage;
a second TFT, wherein, a gate of the second TFT is connected to a first circuit node; a drain and a source of the second TFT are respectively connected to the gate signal node and the first low direct current (DC) input voltage;
a third TFT, wherein, a gate of the third TFT is connected to a second circuit node; a drain and a source of the third TFT are respectively connected to the first circuit node and a second low direct current (DC) input voltage;
a fourth TFT, wherein, a source of the fourth TFT is connected to the first circuit node; a gate and a drain of the fourth TFT are both connected to a first clock signal;
a sixth TFT, wherein, a drain of the sixth TFT T54 is connected to the first clock signal CK; a gate and a source of the sixth TFT T54 are both connected to the first circuit node;
an eighth TFT, wherein a gate of the eighth TFT is connected to the second clock signal, a drain and a source of the eighth TFT are respectively connected to the Nth stage horizontal scanning line and inputting the first low direct current (DC) input voltage;
a ninth TFT, wherein, a gate of the ninth TFT is connected to the gate of the eighth TFT; a drain and a source of the ninth TFT are respectively connected to the gate signal node and inputting the (N−1)th stage starting signal;
a second pull-down holding circuit;
a pull-up control circuit;
a transfer circuit; and
a boast capacitor;
wherein, the first clock signal and the second clock signal are two complementary signals in phase; the second low direct current (DC) input voltage is lower than the first low direct current (DC) input voltage.

9. The GOA circuit for the liquid crystal display according to claim 8, wherein, the GOA circuit further comprises: a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage; and
a twelfth TFT, wherein, a source of the twelfth TFT is connected to the gate of the tenth TFT; a drain and a gate of the twelfth TFT are both connected to the first clock signal.

10. The GOA circuit for the liquid crystal display according to claim 9, wherein, the pull-down circuit comprises:
an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage; and a nineteenth TFT, wherein, a gate of the nineteenth TFT is connected to the gate of the eighteenth TFT; a drain and a source of the nineteenth TFT are respectively connected to the gate signal node and the first low direct current (DC) input voltage.

11. The GOA circuit for the liquid crystal display according to claim 10, wherein, the pull-down circuit further comprises:
a twentieth TFT, wherein, a gate of the twentieth TFT is connected to the gate of the eighteenth TFT; a drain and a source of the twentieth TFT are respectively connected to the Nth stage horizontal scanning line and inputting the second low direct current (DC) input voltage.

12. The GOA circuit for the liquid crystal display according to claim 8, wherein, the GOA circuit further comprises a third pull-down holding circuit comprising:
a tenth TFT, wherein, a drain and a source of the tenth TFT are respectively connected to the second circuit node and the second low direct current (DC) input voltage;
an eleventh TFT, wherein, a gate of the eleventh TFT is connected to the gate signal node; a drain and a source of the eleventh TFT are respectively connected to the gate of the tenth TFT and inputting the first low direct current (DC) input voltage;
a twelfth TFT, wherein, a source of the twelfth TFT is connected to the gate of the tenth TFT; a drain and a gate of the twelfth TFT are both connected to the second clock signal; and
a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

13. The GOA circuit for the liquid crystal display according to claim 12, wherein, the pull-down circuit comprises:
an eighteenth TFT, wherein, a gate of the eighteenth TFT is inputting a (N+1)th stage starting signal ST (N+1); a drain and a source of the eighteenth TFT are respectively connected to the Nth stage horizontal scanning line and inputting the first low direct current (DC) input voltage;
a nineteenth TFT, wherein, a gate of the nineteenth TFT is connected to the gate of the eighteenth TFT; a drain and a source of the nineteenth TFT are respectively connected to the gate signal node and the first low direct current (DC) input voltage; and
a seventh TFT, wherein, a gate of the seventh TFT is connected to the first circuit node; a drain and source of the seventh TFT are respectively connected to the second circuit node and the second low direct current (DC) input voltage.

14. The GOA circuit for the liquid crystal display according to claim 10, wherein, the pull-up circuit comprises:
a fifteenth TFT, wherein a gate of the fifteenth TFT is connected to the gate signal node, a drain and a source of the fifteenth are respectively connected to the first clock signal and the Nth stage horizontal scanning line;
the transfer circuit comprises:
a sixteenth TFT, a gate of the sixteenth TFT is connected to the gate signal node; a drain and a source of the sixteenth TFT are respectively connected to the first clock signal and outputting a Nth stage starting signal ST (N); and
the pull-up control circuit comprises:
a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

15. The GOA circuit for the liquid crystal display according to claim 11, wherein, the pull-up circuit comprises:
a fifteenth TFT, wherein a gate of the fifteenth TFT is connected to the gate signal node, a drain and a source of the fifteenth are respectively connected to the first clock signal and the Nth stage horizontal scanning line;
the transfer circuit comprises:
a sixteenth TFT, a gate of the sixteenth TFT is connected to the gate signal node; a drain and a source of the sixteenth TFT are respectively connected to the first clock signal and outputting a Nth stage starting signal ST (N); and
the pull-up control circuit comprises:
a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

16. The GOA circuit for the liquid crystal display according to claim 13, wherein, the pull-up circuit comprises:
a fifteenth TFT, wherein a gate of the fifteenth TFT is connected to the gate signal node, a drain and a source of the fifteenth are respectively connected to the first clock signal and the Nth stage horizontal scanning line;
the transfer circuit comprises:
a sixteenth TFT, a gate of the sixteenth TFT is connected to the gate signal node; a drain and a source of the sixteenth TFT are respectively connected to the first clock signal and outputting a Nth stage starting signal ST (N); and
the pull-up control circuit comprises:
a seventeenth TFT, a gate of the seventeenth TFT is inputting the (N−1)th stage starting signal ST (N−1); a drain and a source of the seventeenth TFT are respectively inputting the (N−1)th stage horizontal scanning line and connected to the gate signal node.

17. A liquid crystal display device including a gate driver on array (GOA) circuit having multiple cascaded GOA units, a Nth stage GOA unit for controlling a charging of a Nth stage horizontal scanning line of a display area, and the Nth stage GOA unit comprising:
a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a first low direct current (DC) input voltage;
a second TFT, wherein, a gate of the second TFT is connected to the first circuit node P; a drain and a source of the second TFT are respectively connected to the gate signal node and the first low direct current (DC) input voltage;
a third TFT, wherein, a gate of the third TFT is connected to a second circuit node; a drain and a source of the third TFT are respectively connected to the first circuit node and a second low direct current (DC) input voltage;

a fourth TFT, wherein, a source of the fourth TFT is connected to the first circuit node; a gate and a drain of the fourth TFT are both connected to a first clock signal; and a seventh TFT, wherein, a gate of the seventh TFT is connected to the first circuit node; a drain and source of the seventh TFT are respectively connected to the second circuit node and the second low direct current (DC) input voltage;

a second pull-down holding circuit;

a pull-up control circuit;

a transfer circuit; and a boast capacitor;

wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the second low direct current (DC) input voltage is lower than the first low direct current (DC) input voltage.

18. The liquid crystal display device according to claim 17, wherein, the second pull-down holding circuit comprises:
an eighth TFT, wherein a gate of the eighth TFT is connected to the second clock signal, a drain and a source of the eighth TFT are respectively connected to the Nth stage horizontal scanning line and inputting the first low direct current (DC) input voltage; and a ninth TFT, wherein, a gate of the ninth TFT is connected to the gate of the eighth TFT; a drain and a source of the ninth TFT are respectively connected to the gate signal node and inputting the (N−1)th stage starting signal ST (N−1);

the first pull-down holding circuit further comprises:
a sixth TFT, wherein, a drain of the sixth TFT is connected to the first clock signal; a gate and a source of the sixth TFT are both the first circuit node;

wherein, the first clock signal and the second clock signal are two complementary signals in phase.

19. The liquid crystal display device according to claim 18, wherein, the GOA circuit further comprises: a third pull-down holding circuit comprising:

a tenth TFT, wherein, a drain and a source of the tenth TFT are respectively connected to the second circuit node and the second low direct current (DC) input voltage;

an eleventh TFT, wherein, a gate of the eleventh TFT is connected to the gate signal node; a drain and a source of the eleventh TFT are respectively connected to the gate of the tenth TFT and inputting the first low direct current (DC) input voltage; and a twelfth TFT, wherein, a source of the twelfth TFT is connected to the gate of the tenth TFT; a drain and a gate of the twelfth TFT are both connected to the first clock signal.

20. The liquid crystal display device according to claim 18, wherein, the GOA circuit further comprises: a third pull-down holding circuit comprising:

a tenth TFT, wherein, a drain and a source of the tenth TFT are respectively connected to the second circuit node and the second low direct current (DC) input voltage;

an eleventh TFT, wherein, a gate of the eleventh TFT is connected to the gate signal node; a drain and a source of the eleventh TFT are respectively connected to the gate of the tenth TFT and inputting the first low direct current (DC) input voltage;

a twelfth TFT, wherein, a source of the twelfth TFT is connected to the gate of the tenth TFT; a drain and a gate of the twelfth TFT are both connected to the second clock signal; and a thirteenth TFT, wherein, a source of the thirteenth TFT is connected to the gate of the tenth TFT; a drain of the thirteenth TFT is connected to the second clock signal; a gate of the thirteenth TFT is connected to the first clock signal.

* * * * *